(12) United States Patent
Nastasa et al.

(10) Patent No.: US 9,153,886 B2
(45) Date of Patent: Oct. 6, 2015

(54) PIN HEADER ASSEMBLY AND METHOD OF FORMING THE SAME

(71) Applicants: Catalin Nastasa, Clarkston, MI (US); Jacobo Barraza-Rubio, Rochester Hills, MI (US)

(72) Inventors: Catalin Nastasa, Clarkston, MI (US); Jacobo Barraza-Rubio, Rochester Hills, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 173 days.

(21) Appl. No.: 13/661,457

(22) Filed: Oct. 26, 2012

(65) Prior Publication Data

US 2014/0118973 A1    May 1, 2014

(51) Int. Cl.
| | |
|---|---|
| *H01R 9/00* | (2006.01) |
| *H01R 13/42* | (2006.01) |
| *H01R 43/16* | (2006.01) |
| *H01R 12/58* | (2011.01) |
| *H05K 3/34* | (2006.01) |

(52) U.S. Cl.
CPC ............ *H01R 12/585* (2013.01); *H05K 3/3447* (2013.01); *H05K 2201/1059* (2013.01); *H05K 2201/10189* (2013.01); *H05K 2201/10303* (2013.01); *H05K 2201/10424* (2013.01); *H05K 2201/10856* (2013.01); *H05K 2201/10871* (2013.01); *H05K 2201/2036* (2013.01); *Y10T 29/49204* (2015.01); *Y10T 156/1062* (2015.01)

(58) Field of Classification Search
CPC ....... H05K 1/14; H05K 1/141; H05K 3/3447; H05K 2201/2036; H05K 2201/10303; H01R 12/585

USPC ......... 361/760, 770, 772, 774, 785, 791, 804, 361/742; 29/874, 877, 881; 439/75, 590, 439/751, 943

See application file for complete search history.

(56) References Cited

U.S. PATENT DOCUMENTS

| | | | |
|---|---|---|---|
| 3,989,331 A | 11/1976 | Hanlon | |
| 4,217,024 A * | 8/1980 | Aldridge et al. | ............... 439/381 |
| 5,469,330 A * | 11/1995 | Karabatsos et al. | .......... 361/704 |
| 5,518,427 A * | 5/1996 | Kan et al. | ....................... 439/736 |
| 6,545,890 B2 * | 4/2003 | Pitzele | .......................... 363/147 |
| 6,581,276 B2 * | 6/2003 | Chung | ............................ 29/825 |
| 6,623,280 B2 * | 9/2003 | Oldenburg et al. | ............. 439/75 |
| 6,790,051 B1 * | 9/2004 | Secall et al. | ..................... 439/78 |
| 7,083,431 B1 * | 8/2006 | Darr et al. | ....................... 439/75 |

(Continued)

FOREIGN PATENT DOCUMENTS

| | | |
|---|---|---|
| EP | 1577689 A1 | 9/2005 |
| WO | 2009/077819 A1 | 6/2009 |

OTHER PUBLICATIONS

International Search Report and Written Opinion dated Mar. 13, 2014, from corresponding International Patent Application No. PCT/US2013/066887.

*Primary Examiner* — Hoa C Nguyen

(57) ABSTRACT

Improved pin header assemblies, printed circuit board assemblies and methods of forming the same are disclosed. In an aspect, a method of forming a pin header assembly for use with a printed circuit board is provided. The method includes the step of providing a base formed of an electric insulator. The method further includes the step of forming a plurality of openings through the base. The method further includes the step of inserting a plurality of conductive pins through the openings, wherein a press fit is formed between the conductive pins and the base, and the conductive pins extend from opposite sides of the base.

20 Claims, 4 Drawing Sheets

(56) References Cited

U.S. PATENT DOCUMENTS

| | | | |
|---|---|---|---|
| 7,135,644 B1 * | 11/2006 | Gilliland et al. | 174/383 |
| 7,172,439 B1 * | 2/2007 | Yokobatake et al. | 439/83 |
| 8,391,022 B2 * | 3/2013 | Olesiewicz et al. | 361/810 |
| 2004/0145880 A1 * | 7/2004 | Watanabe et al. | 361/803 |
| 2005/0208797 A1 * | 9/2005 | Duncan et al. | 439/83 |

* cited by examiner

PIN HEADER ASSEMBLY AND METHOD OF FORMING THE SAME

BACKGROUND

Pin headers are commonly used for connecting electrical components to a printed circuit board. Pin headers typically include a plurality of pins extending from a base, the pins are configured for engagement with an electrical component, such as through a ribbon cable connector or otherwise, and for engagement with a printed circuit board. More specifically, individual pins of the pin header are inserted through openings formed in the printed circuit board. The pin headers are affixed to the printed circuit board through reflow soldering process, using soldering paste, to ensure electrical connection.

While the material forming the conductive pins may vary, the material forming the base should be particularly suited for use with printed circuit boards. For example, the base material should be heat resistant so as to withstand elevated temperatures commonly encountered during activation of solder paste used for mounting components to a printed circuit board. Commonly, this reflow soldering process sometimes subjects the electrical components to temperatures in the range of about 260° C. or more. Also, the base material should be electrically insulating and suitably strong for supporting pins. These features have lead to the use of specialized thermoplastics. Unfortunately, the materials particularly suited for these types of applications, and temperatures, can be relatively expensive, comparatively, for low volume productions.

Some pin headers are being formed utilizing over-molding processes, whereby a base is formed about a plurality of pins. The utilization of over-molding processes requires the creation and purchasing of unique tools, such as injection moldings. Moreover, other pin forming techniques require the use of specialized pin pushing and stamping tools. Furthermore, the shipment cost of tools and completed components can be appreciable. While such methods may be cost effective for large volume production applications, they are not cost effective, and relatively expensive, for low production applications wherein only several, dozens or even a few hundred pin headers are needed. This can be the case in research and development projects, low volume production applications or otherwise.

SUMMARY

In view of the foregoing, there exists a need for improved pin headers, and methods of forming the same, that are particularly suited for use with printed circuit boards and relatively low in cost compared to traditional pin headers, for low volume production, research and development, and experimentation.

Improved pin header assemblies, printed circuit board assemblies and methods of forming the same that reduce forming costs in low production applications, research and development applications, and experimental applications are described. The advancements are based, in part, upon the utilization of low cost, heat resistant and electrically insulating material that is similar to or commonly used to form printed circuit boards. The advancements are further predicated, in part, upon new methods and components used to attached pin headers to circuit board assemblies. The advancements result in the reduction or elimination of tooling costs, shipping costs and material costs. Moreover, the advancements provide the ability to form pin header assemblies and printed circuit board assemblies utilize existing components and tools already in the marketplace. Other advancements will be appreciated as shown and described herewith.

One aspect provides a method of forming a pin header assembly for use with a printed circuit board. The method includes the step of providing a base formed of a heat resistant electric insulator. The method further includes the step of forming a plurality of openings through the base. The method further includes the step of inserting a plurality of conductive pins through the openings, wherein a press fit is formed between the conductive pins and base and the conductive pins extend from opposite sides of the base.

Another aspect provides a method of forming a printed circuit board assembly. The method includes providing a printed circuit board, the printed circuit board including an array of openings formed therein. The method further includes inserting a plurality of conductive pins through openings formed in a heat resistant electric insulator base such that the pins extend beyond opposite sides of the base to form a pin header assembly. The method further includes inserting the pins of the pin header assembly through the array of openings formed by the printed circuit board. The method further includes bonding the pins to the printed circuit board.

Another aspect provides a pin header assembly for use with a printed circuit board. The assembly includes a base formed of a thermoset glass epoxy laminate material, the base defining a plurality of openings formed therethrough. The assembly further includes a plurality of conductive pins extending through the openings of the base, wherein the conductive pins extend from opposite sides of the base.

Another aspect provides a printed circuit board assembly. The assembly includes a printed circuit board defining an array of openings formed therein. The assembly further includes a pin header assembly including a base formed of a thermoset glass epoxy laminate material, the base defining a plurality of openings in which a plurality of conductive pins extend therethrough, wherein the plurality of conductive pins extending into the array of openings and are bonded to the printed circuit board.

These and other features can be best understood from the specification and drawings of which the following of which is a brief description.

DETAILED DESCRIPTION

Figure 1:
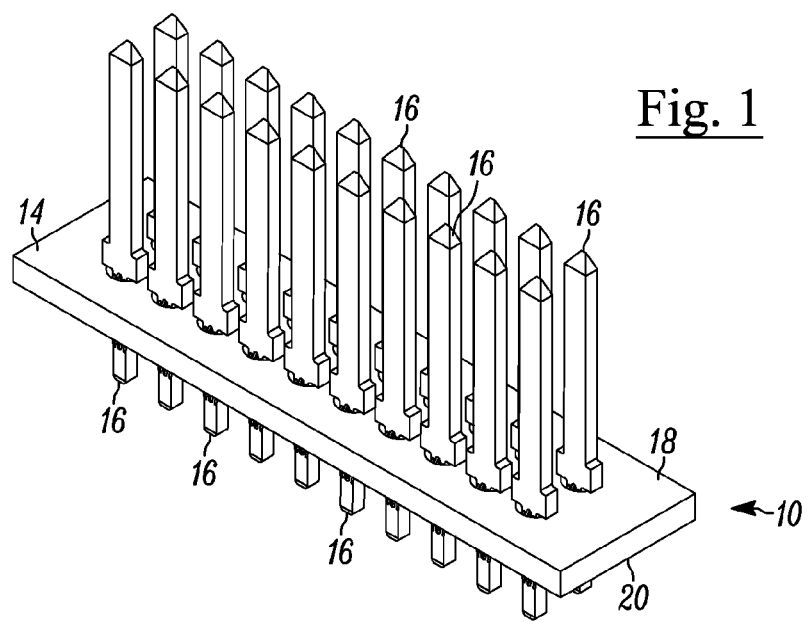
FIG. 1 illustrates a perspective view of an exemplary individual pin header.
Figure 2:
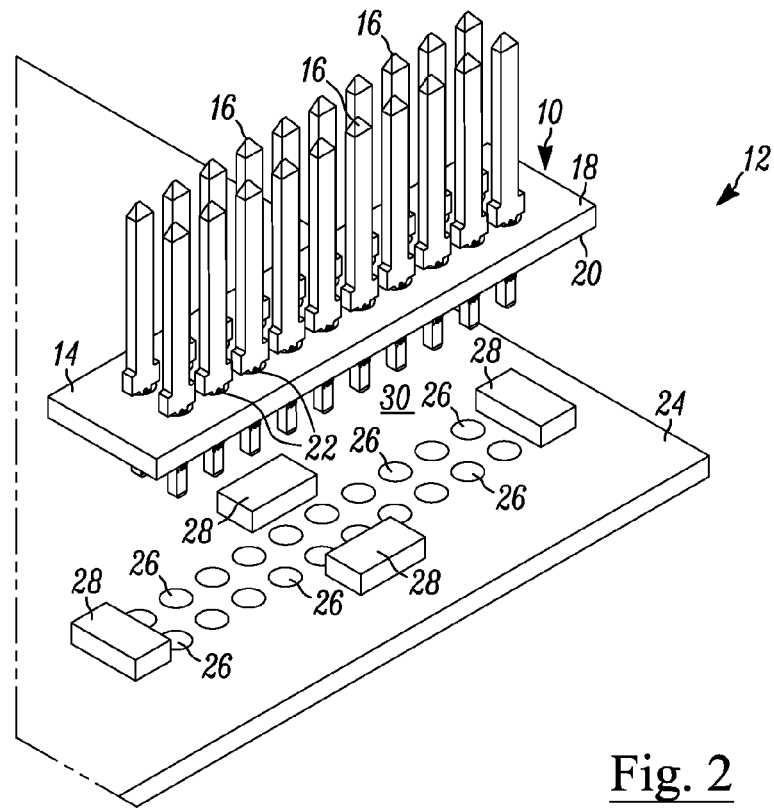
FIG. 2 illustrates an exploded perspective view of an exemplary printed circuit board assembly.
Figure 3:
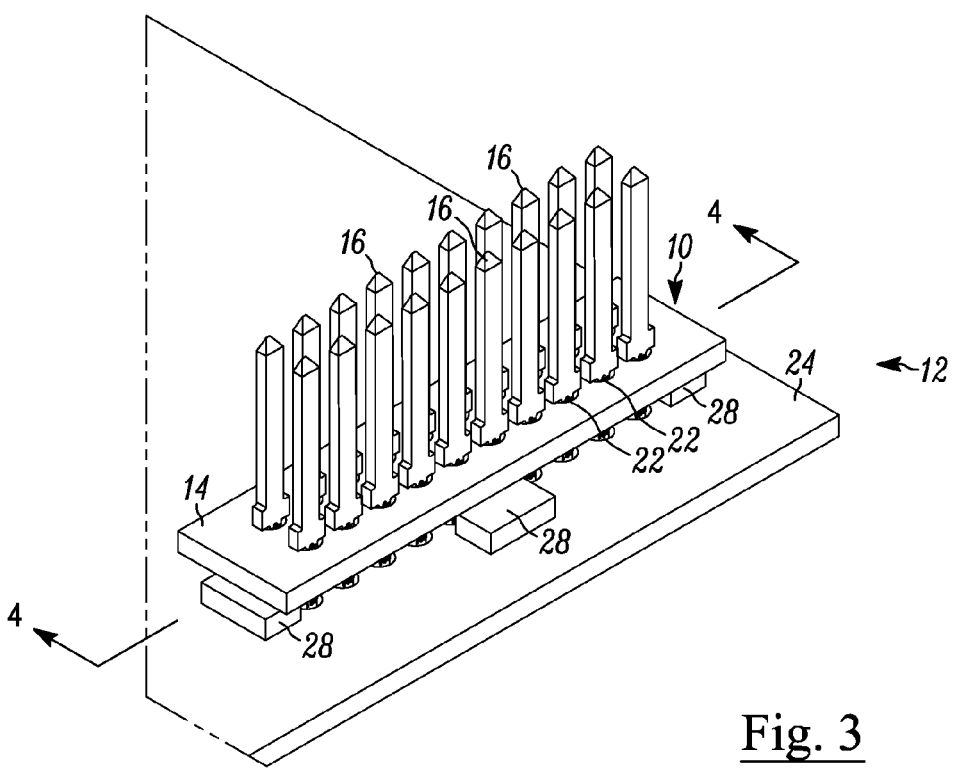
FIG. 3 illustrates a perspective view of the exemplary printed circuit board assembly shown in FIG. 2.

Referring to FIGS. 1 through 3, an exemplary pin header assembly 10 and printed circuit board assembly 12 are shown. The pin header assembly 10 includes a base member 14 and a plurality of pins 16 extending therefrom. The base member 14 includes an upper surface 18 and lower surface 20. The base member 14 further includes a plurality of openings 22 extending between the upper surface 18 and lower surface 20. The plurality of pins extend through the openings 22 and are fixedly attached thereto.

The pin header assembly 10 is configured to engage a printed circuit board 24 to form a printed circuit board assembly 12. Specifically, the conductive pins 16 of the pin header assembly 10 are inserted through openings 26 formed through the printed circuit board 24. Spacers 28 are provided for elevating the pin header assembly 10 above the printed circuit board 24. The conductive pins 16, and hence pin header assembly 10, is fixedly attached to the printed circuit board 24 through a solder paste 30. Advantageously, the spacers 28 allow free flow of the conductive paste during an activation process and protect the integrity of the pin header assembly 10 and printed circuit board assembly 12.

Figure 5:
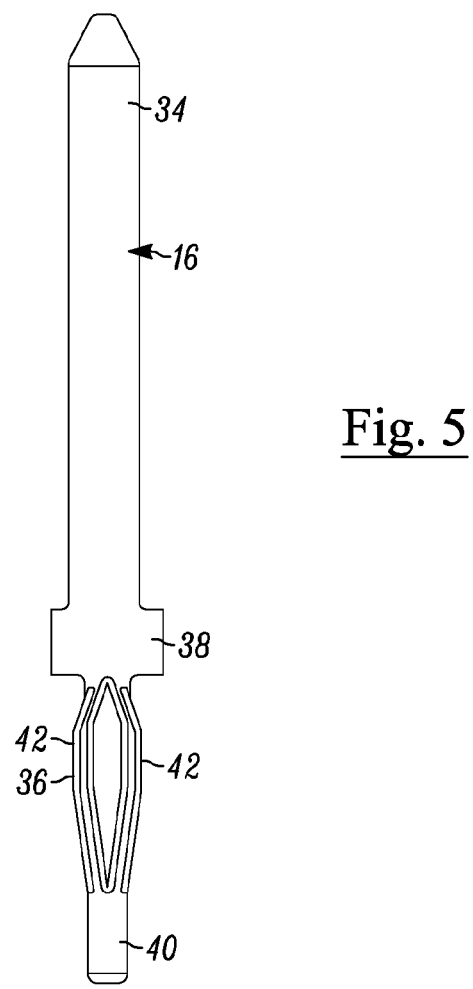
FIG. 5 illustrates a side elevational view of an exemplary conductive pin.

In greater detail, referring to FIGS. 1 and 5, the base member 14 of the pin header assembly 10 is formed of electrically insulating material that is configured to electrically isolate the conductive pins extending through openings 22. The base member 14 is further configured to be heat resistant so as to resist temperatures commonly encountered during an activation process of a solder paste for a printed circuit board. For example, the base member 14 is configured to withstand temperatures of at least about 260° C., over a period of at least about 5 minutes without appreciable deformation or change in other structural integrity. In an example, the material forming the base member 14 comprises a thermoset plastic. In another example, the material forming the base member 14 comprises a glass epoxy laminate. In another example, the material forming the base member 14 comprises an FR-4 fiberglass reinforced epoxy laminate. Accordingly, in an example, the base member material comprises all or a portion of a printed circuit board material, particularly without circuitry or with circuitry that does not interfere with the operation of the conductive pins 16. It should be appreciated that other materials are possible.

The base member 14 comprises a generally flat and rectangular member having upper surface 18 and lower surface 20. In an example, the base member 14 is formed of an electrically insulating laminate. The thickness of the base member 14 may vary. However, in an example, the thickness is generally equal to a thickness of a printed circuit board. Accordingly, in an example, the base member 14 includes a thickness that is less than about 2 mm. In another example, the base member 14 includes a thickness that is about 1.57 mm. Other configurations are possible.

The openings 22 formed through the base member 14 extend between the upper surface 18 and lower surface 20. In an example, the openings form an array of openings, i.e. one or more inline columns and/or one or more inline rows. The array allows a user to utilize all of the openings 22 or selectively utilize desired openings 22 by selectively placing conductive pins 16 therethrough. However, in another example, it is contemplated that the openings 22 may be disposed randomly or according to a specific design.

In an example, the openings 22 are formed through a machining process such as through a drilling, routing or using other suitable machine or device. In an configuration, it is contemplated that each base member 14 is individually machined to form the desired opening 22 configuration. In another configuration, referring to FIG. 7, it is contemplated that the openings 22 are simultaneously formed or formed through a series of machine steps over a plurality of base members 14.

Figure 7:
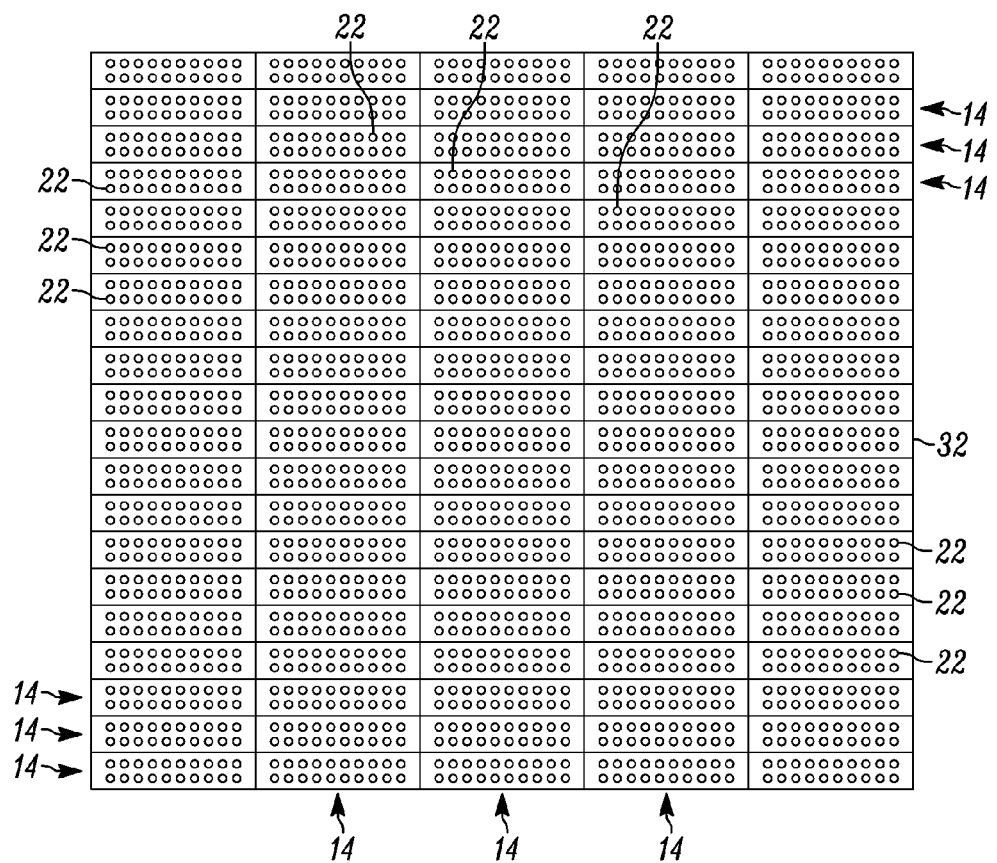
FIG. 7 illustrates a top elevational view of a plurality of exemplary base members.

In an example, still referring to FIG. 7, the base members 14 are formed from a stock member 32, such as a printed circuit board base or otherwise, wherein after formation of desired opening 22 configuration, the stock member is machined, through a cutting process, to form individual base members 14. It should be appreciated that the opening 22 configurations of the individual base members 14 may be similar or different. Further, it is contemplated that certain individual base members 14 may or may not have openings 22 formed therein.

With respect to machining processes to form openings 22 or individual base members 14, it is contemplated that suitable machines and processes would be utilized. For example, in several examples, the openings 22 and formation of individual base members 14 are formed through the use of a printed circuit board router and/or printed circuit board driller. Other configurations are possible.

Referring to FIG. 5, an exemplary conductive pin 16 of the pin header assembly 10 is shown. In this example, the conductive pin 16 includes a connector portion 34 configured for connection to electric components to be placed in communication with a printed circuit board assembly 12. The conductive pin 16 further includes an engagement portion 36 for attachment to a base member 14 of the pin header assembly 10. The conductive pin 16 further includes a shoulder portion 38 for positioning the conductive pin with respect to the base member 14. The conductive pin 16 further includes a PCB connector portion 40 for connection to a printed circuit board 24.

In an example, the engagement portion 36 of the conductive pin 16 is configured to form a press-fit with the base member 14 through a friction fit formed between the engagement portion and walls forming the openings 22. For example, in an configuration, referring to FIG. 4, the engagement portion is press-fit into opening 22 through inward and outward movement of outer walls 42 of the engagement portion 36. In an example, upon full engagement of the conductive pin 16 with the base member 14, the shoulder portion 38 prevents or limits further insertion of the conductive pin through the base member. Significantly, the preceding may help ensure a suitable length of the PCB connector portion 40 for connection to a printed circuit board 24 through a suitable soldering paste or otherwise.

The conductive pins 16 are configured in shape for both insertion through a base member 14 and connection to both a printed circuit board 24 and another connector. In certain situations, one or more spacers 28 are utilized between the base member 14 and printed circuit board 24 to ensure flow of solder past along a surface of the printed circuit board. In an example, to ensure suitable connection to a printed circuit board 24, it is contemplated that the PCB connector portion 40 extends beyond the base member 14 by a distance of at least about twice the thickness of the base member. In another example, it is contemplated that the PCB connector portion 40 extends beyond the base member 14 by a distance of at least about three times the thickness of the base member. Significantly, the preceding may help ensure suitable surface area for attachment of the conductive pins 16 to a printed circuit board 24 utilizing a suitable soldering paste 30, particularly when utilizing one or more spacers 28.

The material forming the conductive pin 16 may comprise any material suitable for forming a communication link between a printed circuit board 24 and another electrical component. In an example, the conductive pin 16 is formed of metal that provides excellent electrical conductivity, strength and resiliency. In an example, it is contemplated that the conductive pins 16 are formed through a stamping process.

Figure 4:
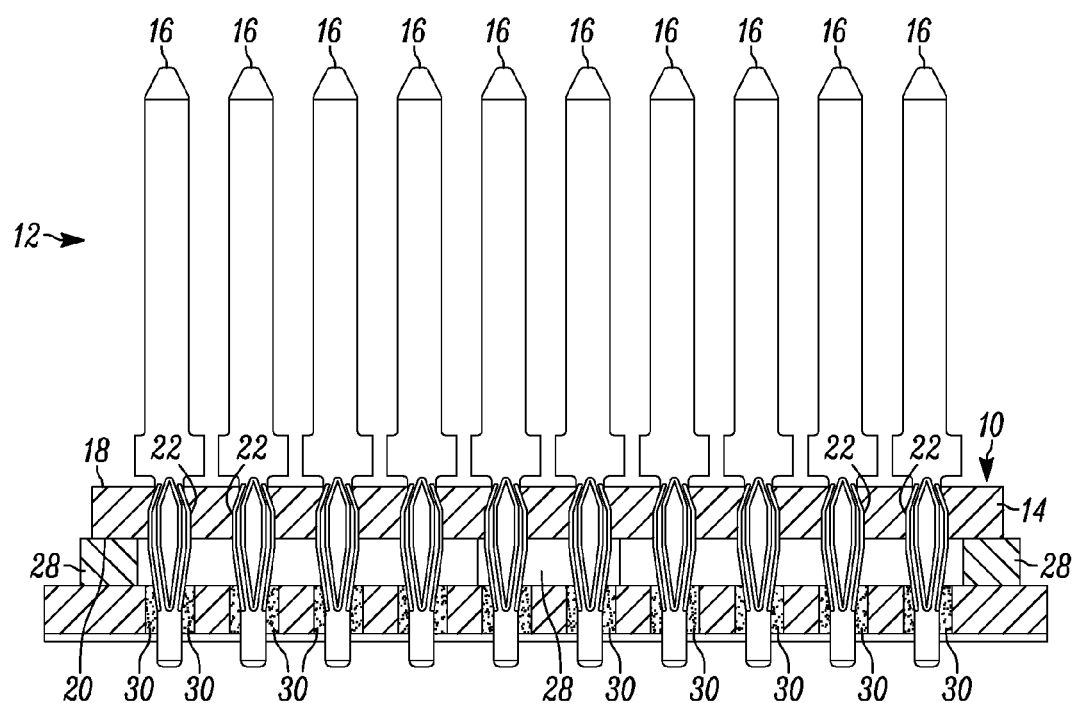
FIG. 4 illustrates a cross-sectional view of the exemplary printed circuit board assembly shown in FIG. 3.
Figure 6:
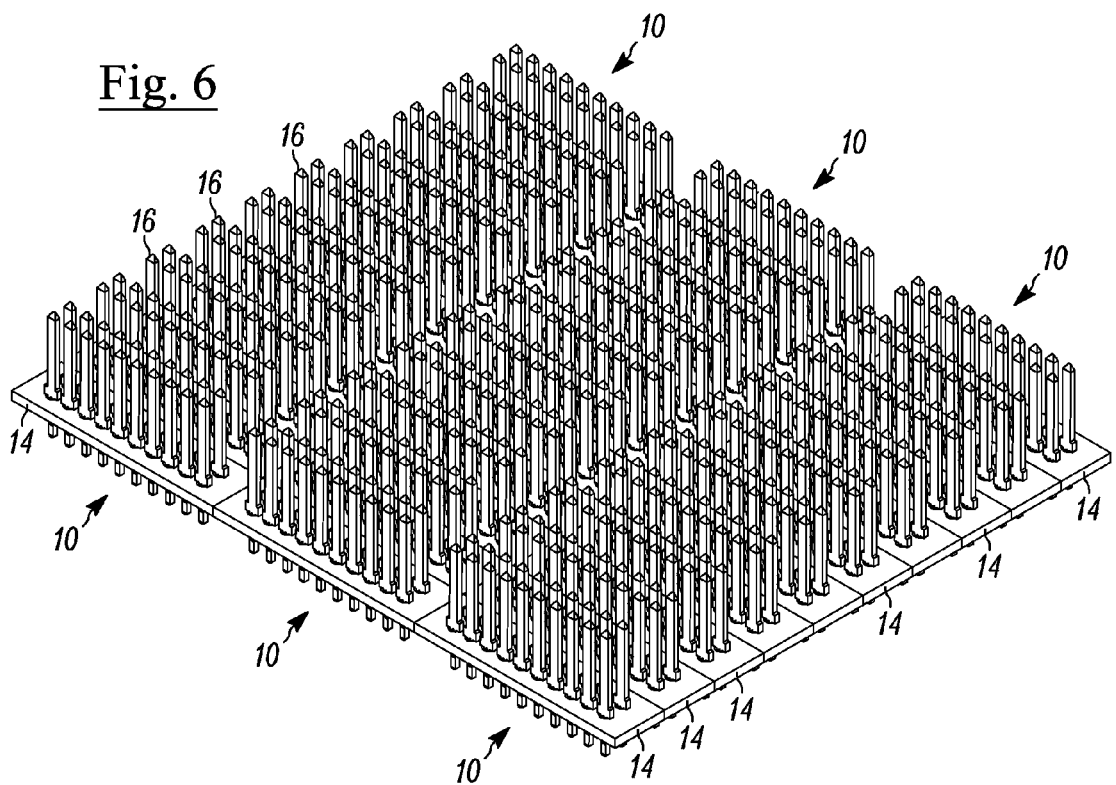
FIG. 6 illustrates a perspective view of a plurality of exemplary pin header assemblies.

As previously described, referring to FIGS. 2 through 4, a printed circuit board assembly 12 is further contemplated. The printed circuit board assembly 12 includes a printed circuit board 24 and one or more of the pin header assemblies 10 of the present invention. The printed circuit board assembly 12 includes openings 26 for receiving the conductive pins 16 of the pin header assembly 10. As previously mentioned, in an example, the printed circuit board assembly 12 further includes one or more, or plurality, of spacers 28. In certain circumstances, the spacers aid in the flow of solder past 30 along a surface of the printed circuit board 24 and maintains integrity of the printed circuit board and pin header assembly 10.

In an example, the openings 26 of the printed circuit board 24 are formed through a machining process such as through the use of a drill, router or other suitable machine or device. With respect to machining processes to form openings 26, it is contemplated that suitable machines and processes would be utilized, such as through the use of a printed circuit board router and/or printed circuit board driller. Other configurations are possible. In an example, the openings 26 of the printed circuit board 24 and the openings 22 of the pin header assembly 10 are generally aligned. In other examples, it is contemplated that the printed circuit board 24 or base member 14 may have more or less openings than that of the other of said printed circuit board or base member. Further it is contemplated that all of the openings 22, 26 may not be aligned, such as where a pin header assembly 10 is configured generically for multiple applications.

Attachment of the pin header assembly 10 to the printed circuit board 24 is achieved through placement of the conductive pins 16 of the pin header assembly 10 through the openings 26 of the printed circuit board 24. The conductive pins 16, and hence pin header assembly 10, are fixedly attached to printed circuit board 24 through a solder paste 30. In an example, solder paste 30 is applied over a surface of the printed circuit board 24 and enters the openings 26 to bond the conductive pins 16 to the printed circuit board. This is achieved during an activation step where the printed circuit board assembly is subjected to elevated temperatures, e.g. about 260° C. or higher, for a period of 5 or more minutes. As previously mentioned, in an example, the spacers 28 are utilized to assist flow of the soldering past by maintaining the base member 14 above the printed circuit board 24 and which reduces potential of direct and unwanted electrical contact between the base member and printed circuit board.

The material forming the printed circuit board 24 may comprise any suitable material for effectuating desired electrical connection. In an example, the printed circuit board 24 is formed of a thermoset plastic. In another example, the material forming the printed circuit board 24 comprises a glass epoxy laminate. In another example, the material forming the printed circuit board 24 comprises an FR-4 fiberglass reinforced epoxy laminate. Accordingly, in an example, the printed circuit board and the base member 14 are formed of all or a portion of the same material. It should be appreciated that other materials are possible.

The material forming the spacers 28 may comprise any suitable material consistent with components used for printed circuit board assemblies. In an example, the material forming the spacer 28 comprises an electrically insulating material, such as plastic, ceramic or otherwise. In another configuration, the material forming the spacer comprises one or more of the materials forming the base member 14 or printed circuit board 24. It should be appreciated that other materials are possible.

In view of the foregoing, methods of forming pin header assemblies 10 and printed circuit board assemblies 12 are further contemplated. The method includes the step of forming a pin header assembly 10 by forming a base member 14 including a plurality of openings 22 formed therethrough. One or more, or plurality, of conductive pins 16 are inserted through the openings such that the pins extend from both sides of the base portion to include a connector portion 34 for an electrical component and a PCB connector portion 40 for a printed circuit board 24. The conductive pins 16 are fixedly attached to the base portion 14 through a press fit formed between the engagement portion 36 of the conductive pins 16 and the walls forming the openings 22 through the base member 14. Solder paste 30 and one or more spacers 28 are then disposed between the pin header assembly 10 and the printed circuit board 24. The conductive pins 16 of the pin header assembly 10 are inserted through the opening 26 formed through the printed circuit board 24 until the base member rests against the spacers 28 which further rests against the printed circuit board 24. The adjoined pin header assembly 10 and printed circuit board assembly 12 are subjected to heat, as described herein, for a period of time until the soldering past 30 activates and adheres the conductive pins 16 and spacers 28 to the printed circuit board 24. It should be appreciated that more or less steps may be involved as shown and described herein.

While the description is at least with reference to a preferred embodiment it will be understood by those skilled in the art that various changes may be made and equivalents may be substituted for elements thereof without departing from the scope of the claims. In addition, many modifications may be made to adapt a particular situation or material to the teachings without departing from the essential scope thereof. Therefore, it is intended that the claims not be limited to the particular embodiment disclosed as the best mode contemplated for carrying out this invention, but that all embodiments fall within the scope of the appended claims.

The invention claimed is:

1. An assembly comprising:
   a base comprising one or more materials selected from a group consisting of glass epoxy laminate and thermoset plastic, the base defining a plurality of openings formed therethrough; and
   a plurality of conductive pins extending through the openings of the base, the pins being in a press fit relationship with the base, the press fit relationship formed through inward and outward movement of walls of an engagement portion of each pin, the engagement portion defining an open cavity between the walls, the cavity having a substantially hexagonal cross section, wherein the conductive pins extend from opposite sides of the base, the engagement portion being between a first portion and a second portion of each pin, the first portion of each pin on one side of the base and the second portion of each pin on the other side of the base, the second portion comprising a connector portion configured to engage an electrical component and a shoulder portion configured to limit insertion of the pin through the base and ensure the first portion extends suitably far beyond the base to connect to a printed circuit board through soldering paste, the first portion configured to pass through a corresponding opening in the base and to connect to the printed circuit board through the soldering paste, the printed circuit board being different from the electrical component and the base.

2. The assembly of claim 1, wherein the base comprises glass epoxy laminate.

3. The assembly of claim 1, wherein the base comprises thermoset plastic.

4. The assembly of claim 1, wherein the ends of the pins extend beyond the base by a distance of at least twice the thickness of the base.

5. The assembly of claim 1, wherein the printed circuit board defining an array of openings formed therein; wherein the plurality of conductive pins extend into the array of openings of the printed circuit board and are bonded to the printed circuit board.

6. The assembly of claim 5, further comprising one or more spacers disposed between the base and the printed circuit board, wherein the one or more spacers are configured to aid in the flow of soldering paste along a surface of the printed circuit board.

7. The assembly of claim 6, wherein the one or more spacers are bonded to the printed circuit board.

8. The assembly of claim 6, wherein the one or more spacers are formed of an electric insulator.

9. The assembly of claim 5, wherein the printed circuit board and the base comprise the same material.

10. The assembly of claim 5, wherein the plurality of openings in the base is one of more and less numerous than the number of openings in the array of openings in the printed circuit board and wherein the pins are selectively placed in the plurality of openings in the base and correspond to the openings in the printed circuit board.

11. A method of forming a pin header assembly, the method comprising:
providing a base comprising an electric insulator;
forming a plurality of openings through the base; and
inserting a plurality of conductive pins through the openings until a shoulder portion of each pin limits further insertion and a first portion of each pin extends suitably far beyond the base to connect to a printed circuit board through soldering paste, wherein a press fit is formed between the conductive pins and the base through inward and outward movement of walls of an engagement portion of each pin, the engagement portion defining an open cavity between the walls, the cavity having a substantially hexagonal cross section, and the conductive pins extend from opposite sides of the base, the first portion of each pin on one side of the base and a second portion of each pin on the other side of the base, the engagement portion being between the first portion and the second portion, the second portion comprising a connector portion configured to engage an electrical component and the shoulder portion configured to limit insertion of the pin through the base and ensure the first portion extends suitably far beyond the base to connect to the printed circuit board through the soldering paste, the first portion configured to pass through a corresponding opening in the base and connect to the printed circuit board through the soldering paste, the printed circuit board being different from the electrical component and the base.

12. The method of claim 11, wherein the base comprises one or more materials selected from a group consisting of glass epoxy laminate and thermoset plastic.

13. The method of claim 11, wherein the plurality of openings is formed through a machining process.

14. The method of claim 11, wherein the ends of the pins extend beyond the base by a distance of at least twice the thickness of the base.

15. The method of claim 11, wherein the pins are formed through a stamping process.

16. The method of claim 11, further comprising the step of cutting the base into a plurality of segments each having conductive pins extending therefrom to form individual pin header assemblies.

17. A method of forming a circuit board assembly, the method comprising:
forming a pin header assembly, the forming comprising inserting a plurality of conductive pins through openings formed in an electric insulator base until a shoulder portion of each pin limits further insertion and a first portion of each pin extends suitably far beyond the base to connect to a printed circuit board through soldering paste, wherein a press fit is formed between the conductive pins and the base through inward and outward movement of walls of an engagement portion of each pin, the engagement portion defining an open cavity between the walls, the cavity having a substantially hexagonal cross section, such that the pins extend beyond opposite sides of the base to form a pin header assembly, the first portion of each pin on one side of the base and a second portion of each pin on the other side of the base, the engagement portion being between the first portion and the second portion, the second portion comprising a connector portion configured to engage an electrical component and the shoulder portion configured to limit insertion of the pin through the base and ensure the first portion extends suitably far beyond the base to connect to the printed circuit board through the soldering paste, the first portion configured to pass through a corresponding opening in the base and to connect to the printed circuit board through the soldering paste, the printed circuit board being different from the electrical component and the base;
providing the printed circuit board, the printed circuit board defining an array of openings formed therein;
inserting the first portion of each pin through a corresponding opening in the array of openings formed by the printed circuit board; and
bonding the first portion of each pin to the printed circuit board.

18. The method of claim 17, further comprising the step of disposing one or more spacers between the pin header assembly and the printed circuit board, wherein the one or more spacers are configured to aid in the flow of soldering paste along a surface of the printed circuit board.

19. The method of claim 18, further comprising the steps of applying a layer of soldering paste over the printed circuit board and heating the soldering paste to bond the first portion of each pin and the one or more spacers to the printed circuit board.

20. The method of claim 17, wherein the base comprises one or more materials selected from a group consisting of glass epoxy laminate and thermoset plastic.

\* \* \* \* \*